(12) United States Patent
Grosshart

(10) Patent No.: US 6,349,744 B1
(45) Date of Patent: Feb. 26, 2002

(54) MANIFOLD FOR MODULAR GAS BOX SYSTEM

(75) Inventor: Paul Francis Grosshart, Billerica, MA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 09/687,572

(22) Filed: Oct. 13, 2000

(51) Int. Cl.⁷ .............................................. F16K 11/10
(52) U.S. Cl. ...................................... 137/884; 137/269
(58) Field of Search ........................... 137/884, 269, 137/270

(56) References Cited

U.S. PATENT DOCUMENTS

| | | | |
|---|---|---|---|
| 3,680,589 A | 8/1972 | Jeans et al. | 137/608 |
| 3,756,274 A | 9/1973 | Wolfgramm | 137/561 R |
| 4,014,364 A | 3/1977 | Matrot | 137/271 |
| 4,476,897 A | 10/1984 | Morrill | 137/594 |
| 4,488,343 A | 12/1984 | Kobelt | 29/157.1 R |
| 4,714,091 A | 12/1987 | Wagner | 137/884 |
| 4,782,852 A | 11/1988 | Legris | 137/269 |
| 5,605,179 A | 2/1997 | Strong, Jr. et al. | 137/884 |
| 5,642,756 A | 7/1997 | Lawrence et al. | 137/884 |
| 5,662,143 A | 9/1997 | Caughran | 137/884 |
| 5,730,181 A | 3/1998 | Doyle et al. | 137/487.5 |
| 5,819,782 A | 10/1998 | Itafuji | 137/240 |
| 5,863,023 A | 1/1999 | Evans et al. | 251/63.5 |
| 5,988,203 A | 11/1999 | Hutton | 137/271 |
| 5,988,463 A | 11/1999 | DiCarlo et al. | 223/99 |
| 5,992,463 A | 11/1999 | Redemann et al. | 137/884 |
| 6,012,479 A | 1/2000 | Fukushima et al. | 137/271 |
| 6,035,893 A | 3/2000 | Ohmi et al. | 137/597 |
| 6,086,013 A * | 7/2000 | Looney, Jr. et al. | 242/594.4 |
| 6,209,571 B1 * | 4/2001 | Itoh et al. | 137/240 |

FOREIGN PATENT DOCUMENTS

WO    WO 98/21744    5/1998

* cited by examiner

*Primary Examiner*—John Fox
(74) *Attorney, Agent, or Firm*—McDermott, Will & Emery

(57) ABSTRACT

A gas manifold for a modular gas box system for delivering contaminant-free, precisely metered quantities of process and purge gases to a semiconductor process reaction chamber. The manifold provides the benefit of allowing the use of standard annular gaskets or o-rings for providing seals between the manifold and gas components, such as filters, valves, and pressure transducers and regulators, mounted on the manifold. The manifold includes a surface, a manifold port in the surface, and at least one station in the surface for receiving gas controlling and gas monitoring components. The station includes an inwardly facing side wall extending into the manifold from the surface to a base of the station. The base is divided into a central portion and an outer portion, the central portion having a first station port, and one of the outer portion of the base and the side wall having a second station port. An internal gas passageway of the manifold connects the manifold port to one of the first and the second station ports.

20 Claims, 5 Drawing Sheets

MANIFOLD FOR MODULAR GAS BOX SYSTEM

FIELD OF DISCLOSURE

The present disclosure relates generally to semiconductor processing equipment and more specifically to a gas box for delivering contaminant-free, precisely metered quantities of process and purge gases to a semiconductor process reaction chamber. More particularly, the present disclosure relates to a manifold for interchangeable use as part of a modular gas box system.

BACKGROUND OF DISCLOSURE

Various recipes are used in the fabrication of semiconductor devices. Such fabrication involves many discrete processing steps where a silicon wafer is cleaned, polished, oxidized, masked, etched, doped, metalized, etc. The steps used, their particular sequence and the materials involved all contribute to the making of particular devices. The fabrication of a single chip can require the careful synchronization and measured delivery of as many as a dozen gases to a reaction chamber.

Accordingly, wafer fabrication facilities are commonly organized to include areas in which chemical vapor deposition, plasma deposition, plasma etching, sputtering and other similar manufacturing processes are carried out. The processing tools, be they chemical vapor deposition reactors, vacuum sputtering machines, plasma etchers or plasma enhanced chemical vapor deposition, must be supplied with various process gases. Pure gases must be supplied to the tools in contaminant-free, precisely metered quantities.

In a typical wafer fabrication facility the gases are stored in tanks, which are connected via piping or conduit to a gas box. The gas box is used to deliver contaminant-free, precisely metered quantities of pure inert or reactant gases from the tanks of the fabrication facility to a process tool. The gas box includes a plurality of gas paths having gas control components, such as valves, pressure regulators and transducers, mass flow controllers and filters/purifiers. Each gas path has its own inlet for connection to separate sources of gas, but all of the gas paths converge into a single outlet for connection to the process tool.

In order to reduce losses associated with semi-conductor processing tool down time for equipment repair or cleaning, there has always been a desire for gas boxes having components that are easily and quickly reconfigured or replaced. In this vein, modular gas boxes modular having components and even whole gas paths that are relatively easy to interchange and replace have been provide.

U.S. Pat. No. 5,992,463 (the '463 patent), for example, shows a modular gas box system including a plurality of gas paths in the form of gas stick assemblies comprising one-piece gas manifolds and gas components mounted on the manifolds. The manifolds are arranged to receive gas at an inlet end, and pass the gas along a plurality of interior channels to a plurality of component receiving stations, and ultimately through a single outlet of the manifold.

The modular gas box system shown in the '463 patent is easier to manufacture than many previous gas boxes, since standardized manifolds having standardized footprints are incorporated in the gas box. The component receiving stations of the substantially rectangular one-piece manifolds are positioned along a top surface of the manifold and the components received thereon communicate with a gas directing passageways defined within the manifolds.

The '463 patent provides many benefits in that each manifold is a standardized, prefabricated component. In addition, there is no necessity to provide welded connections or connectors directly to the gas components, as required by most previous gas box systems, since all connections are made through and supported by the manifolds. The modular gas box system shown in the '463 patent can be easily reconfigured by a user in the field, as welds and other connections need not be broken. A gas controlling or monitoring component may be replaced or added simply by disconnecting the component from the manifold.

While the modular gas box system shown in the '463 patent provides great advantages over the prior art gas boxes, there is still desired an improved modular gas box system. More particularly, there is still desired an improved manifold for use as part of a modular gas box system.

SUMMARY OF DISCLOSURE

Accordingly, the present disclosure provides a gas manifold for a modular gas box system for delivering contaminant-free, precisely metered quantities of process and purge gases to a semiconductor process reaction chamber. The manifold includes a surface, a manifold port in the surface, and at least one station in the surface for receiving gas controlling and gas monitoring components. The station includes an inwardly facing side wall extending into the manifold from the surface to a base of the station. The base is divided into a central portion and an outer portion, the central portion having a first station port, and one of the outer portion of the base and the side wall having a second station port. An internal gas passageway of the manifold connects the manifold port to one of the first and the second station ports.

The manifold provides the benefit of allowing the use of a standard annular gasket or o-ring between the first and the second station ports. These and other advantages of the present disclosure will no doubt become obvious to those of ordinary skill in the art after having read the following detailed description of the preferred embodiment which is illustrated in the drawing figures.

DETAILED DESCRIPTION OF DISCLOSURE

Figure 1:
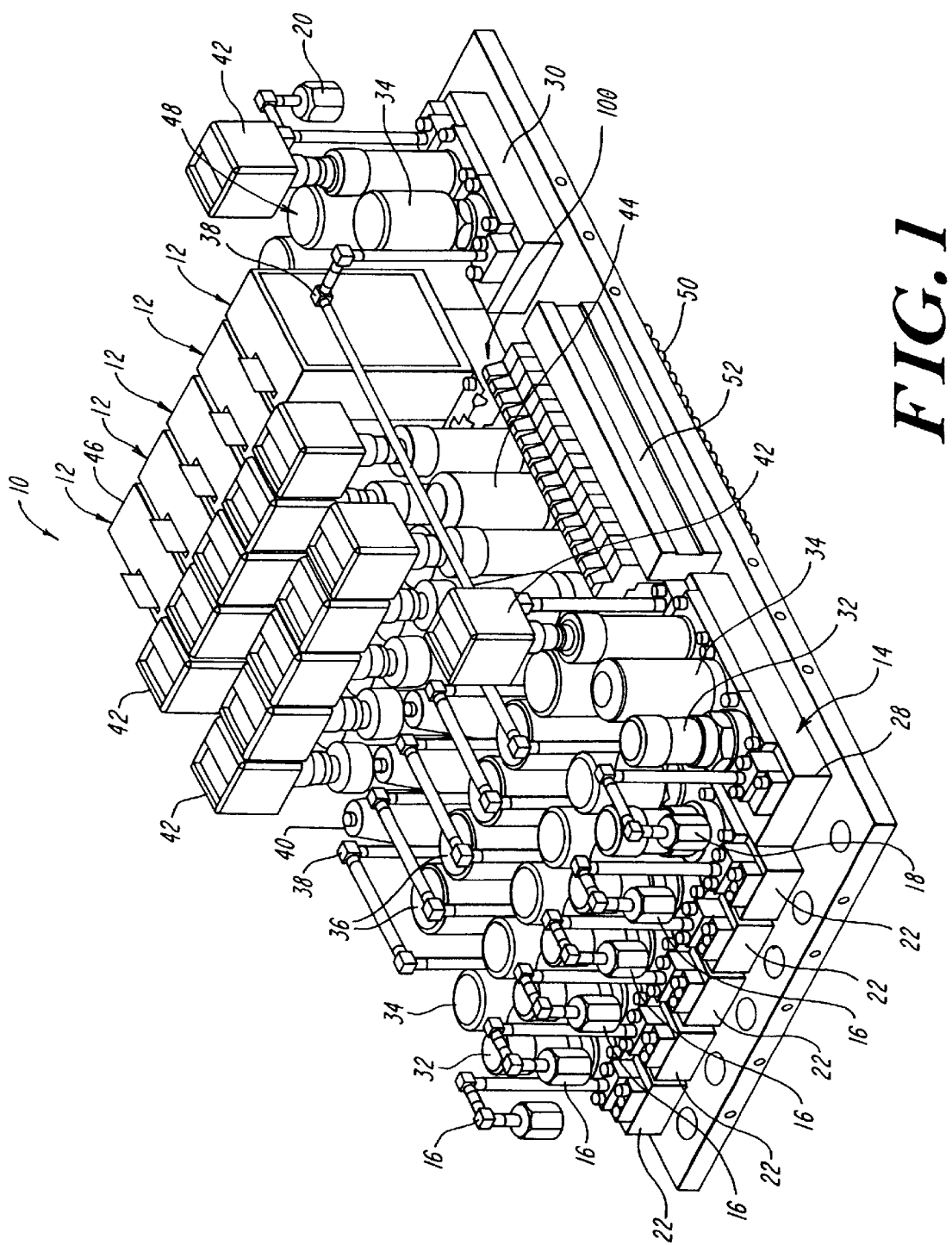
FIG. 1 is a top isometric view of a gas box system incorporating gas manifolds according to the present disclosure.
Figure 2:
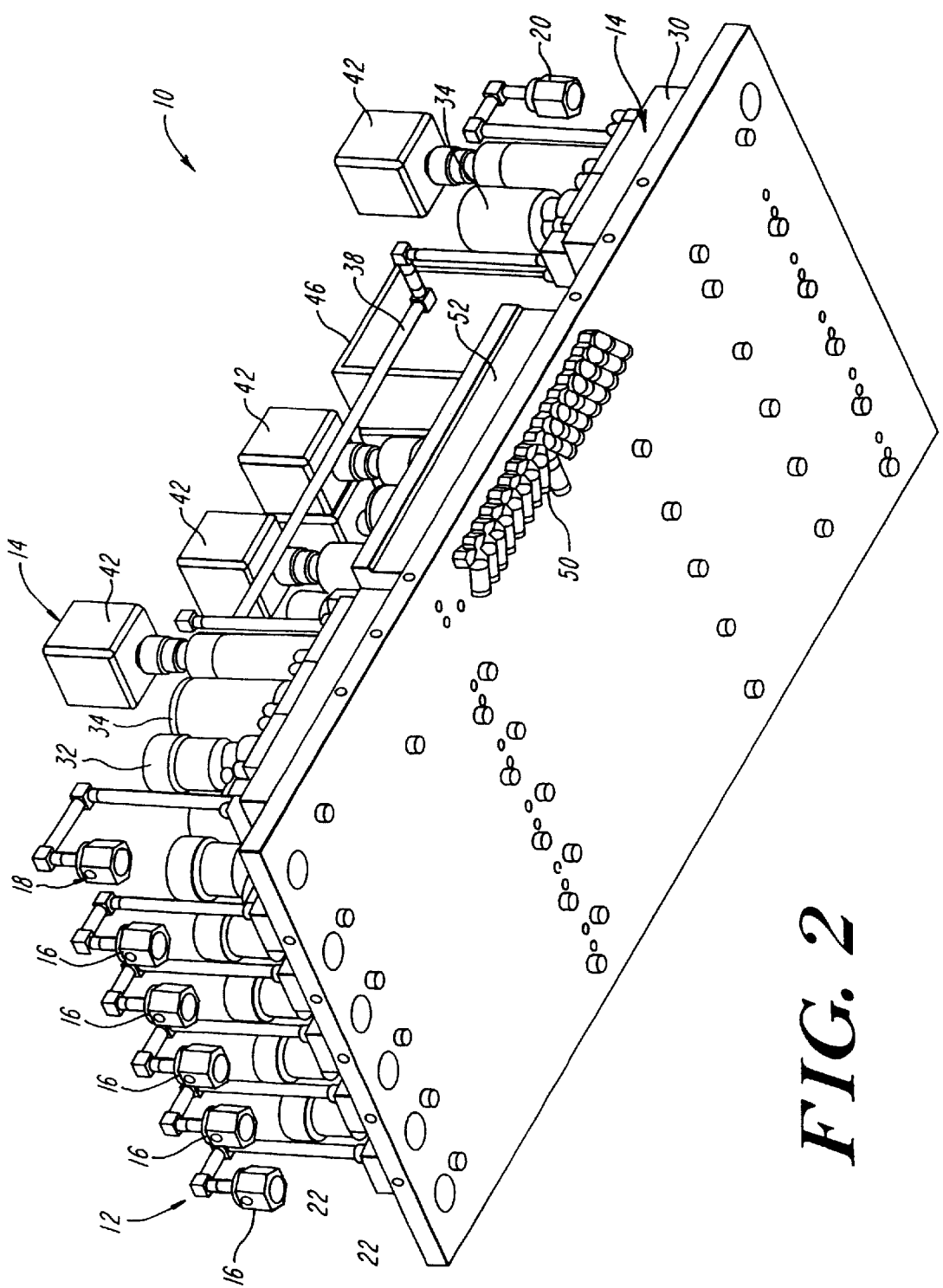
FIG. 2 is a bottom isometric view of the gas box system of FIG. 1.

Referring to the drawings and especially to FIGS. 1 and 2, a modular gas box system 10 is shown that incorporates improved manifolds 100 constructed in accordance with the present disclosure. In general, the gas box system 10 is for receiving and precisely metering a multiplicity of gases. More particular, the gas box system 10 is for receiving multiple gases, including both process gases and purge gases, and for precisely metering the gases to a tool (not shown) for fabricating a semiconductor wafer.

Process gases may include silicon tetrachloride, silane, oxygen, carbon tetrachloride, sulfur hexafluoride, dichlorosilane and ammonia, while purge gases may include dry nitrogen and argon, and a fabricating tool may comprise a chemical vapor deposition reactor, a vacuum sputtering machine, or a plasma etcher. The modular gas box system 10 of FIGS. 1 and 2 is similar to a modular gas box system shown in U.S. Pat. No. 5,992,463, which is incorporated herein by reference.

As shown in FIGS. 1 and 2, the gas box system 10 includes five process gas sticks 12 and a purge gas stick 14. The sticks 12, 14 have their own inlets 16, 18 for connection to separate sources of process and purge gases, but all of the sticks merge into a single outlet 20 for connection to a tool for fabricating a semiconductor wafer. The five process gas sticks 12 are substantially identical and include an inlet manifold 22, a central manifold 100 and an outlet manifold (not viewable), while the purge gas stick 14 includes an inlet manifold 28 and an outlet manifold 30. All of the gas sticks 12, 14 include a plurality of gas components, such as valves, regulators and transducers, which are mounted on the various manifolds. The sticks 12, 14 form controllable gas passageways between the inlets 16, 18 and the single outlet 20 of the gas box system 10, so that a contaminant-free, precise volume of a gas or combination of gases, at a precise pressure, can be supplied from the gas box to a semiconductor wafer fabricating tool.

Each inlet manifold 22 of the process gas sticks 12 has mounted thereon gas components comprising a manual valve 32 and a pneumatic valve 34. A first set of chained pneumatic valves 36 are also mounted on the inlet manifolds 22 of the process gas sticks 12 and are connected together and to the inlet manifold 28 of the purge gas stick 14 to selectively allow a purge gas to flow into an end of one of the process gas sticks 12 when desired. The inlet manifolds 22 are connected to the central manifolds 100 via U-tubes 38, and each central manifold has mounted thereon a pressure regulator 40, pressure transducers 42, a filter/purifier 44, and a mass flow controller 46.

The central manifolds 100 are connected to the outlet manifolds of the process gas sticks 12 via U-tubes 38, and a second set of chained pneumatic valves 48 are mounted on the outlet manifolds and are connected together and to the outlet manifold 30 of the purge gas stick 14 to selectively allow the purge gas to flow into the other end of one of the process gas sticks 12 when desired. The second set of chained pneumatic valves 48 are also connected to the outlet 20 of the gas box 10 to selectively allow a process gas or gases to flow from one or more of the sticks 12 to the outlet of the gas box for delivery to a semiconductor wafer fabricating tool.

The inlet manifold 28 of the purge gas stick 14 has mounted thereon a manual valve 32, a pneumatic valve 34, and a pressure transducer 42. The pressure transducer 42 may feed purge gas through either a U-tube 38 connecting the inlet manifold 28 to the outlet manifold 30 of the purge gas stick 14, or through the first set of chained pneumatic valves 36. The outlet manifold 30 of the purge gas stick 14 has mounted thereon a pneumatic valve 34 and a pressure transducer 42, which may feed purge gas through either the second set of chained pneumatic valves 48 or through the outlet 20 of the gas box 10 for delivery to a semiconductor wafer fabricating tool. All of the pneumatic valves are controlled by a plurality of pneumatic lines 50, which are driven from an electrical control block 52. The electrical control block 52 receives electrical inputs from a suitable outside source.

Figures 3, 4:
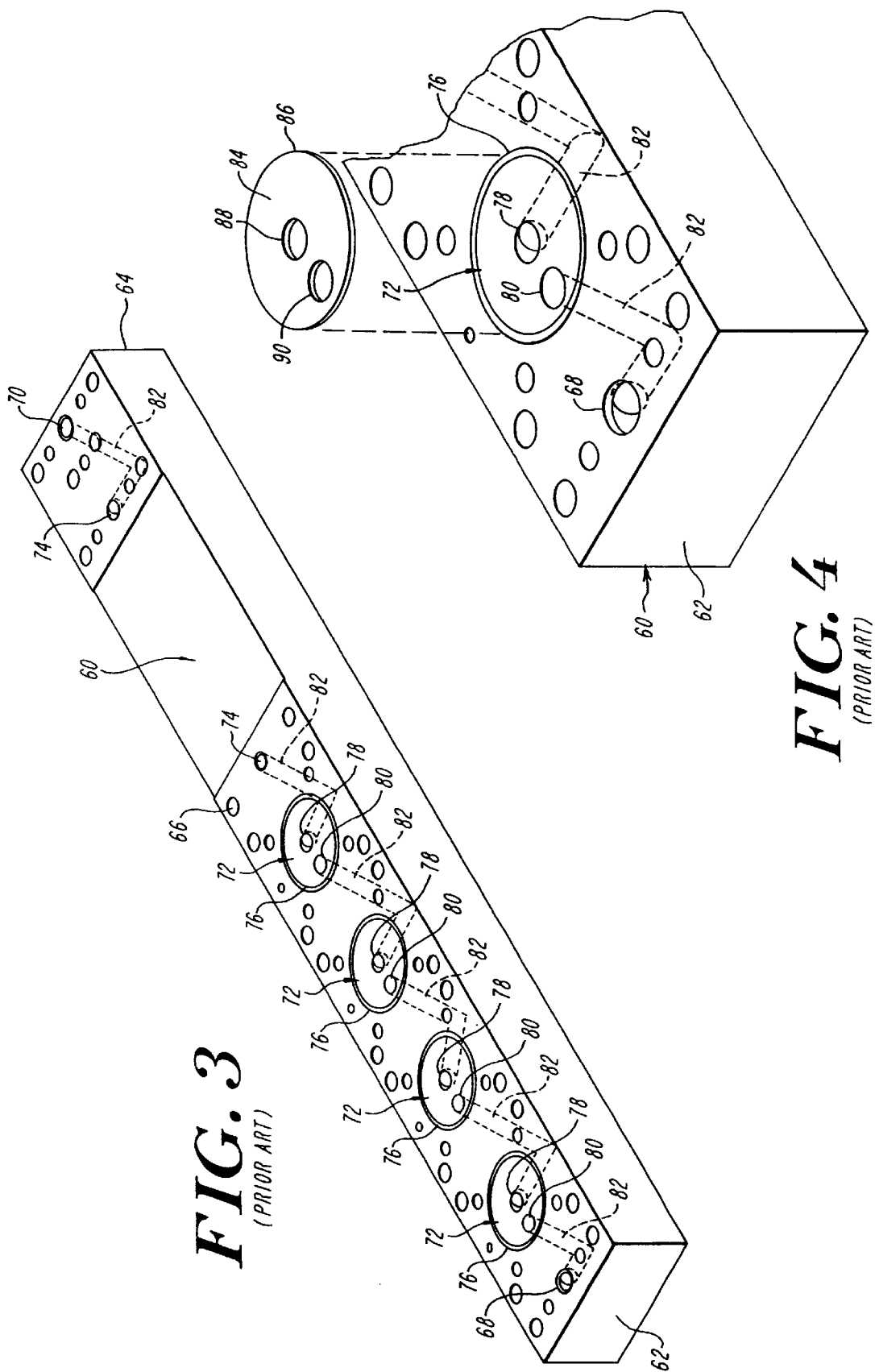
FIG. 3 is a top isometric view of a prior art gas manifold.
FIG. 4 is an enlarged top isometric view of a portion of the prior art gas manifold of FIG. 3 shown with a gasket.

Referring now to FIGS. 3 and 4, a manifold 60 according to the prior art is shown. The manifold 60 is a central manifold 60 for use with the process gas sticks 12 of the gas box system 10 of FIGS. 1 and 2, and is shown and described in U.S. Pat. No. 5,992,463. The manifold 60 is an elongated, rectangular, unitary and solid piece of suitable material, such as stainless steel. The manifold 60 includes first and second end surfaces 62, 64, and a top lateral surface 66 extending between the first and second end surfaces.

The top lateral surface 66 defines an inlet port 68 near the first end surface 62 for receiving the U-tube 38 from the inlet manifold of the process gas stick 12, and an outlet port 70 near the second end surface 64 for receiving the U-tube 38 from the outlet manifold of the process gas stick. Extending successively from the inlet port 68 to the outlet port 70 on the top lateral surface 66 are four component receiving stations 72, and mass flow controller ports 74. The top lateral surface 66 also includes various threaded screw holes surrounding the ports 68, 70, 74 and the stations 72 for securing connectors and components to the manifold 60.

Each of the four component stations 72 includes an outer annular groove 76 for receiving an edge type connector of a gas component. Contained within the groove 76 are a first port 78 centrally located with respect to the outer annular groove, and at least a second port 80 located between the first port and the outer annular groove. The successive ports 68, 70, 74 and stations 72 are connected by passageways 82 within the single-piece manifold 60. Each passageway 82 is preferably formed by two intersecting bores drilled from the top lateral surface 66 such that the passageways are generally V-shaped.

Referring to FIG. 4, a gasket 84 for providing a seal between and around the ports 78, 80 of the station 72 is shown. The gasket 84 is generally flat and has a circular outer circumference 86 sized to fit within the outer annular groove 76 of the station 72 and two openings 88, 90 for alignment with the ports 78, 80 of the station. Since the second port 80 of the station 72 is positioned between the first port 78 and the outer annular groove 76, the gasket 84 must be properly positioned over the station to ensure that the two openings 88, 90 of the gasket 84 are aligned with the ports of the station.

Figures 5, 6:
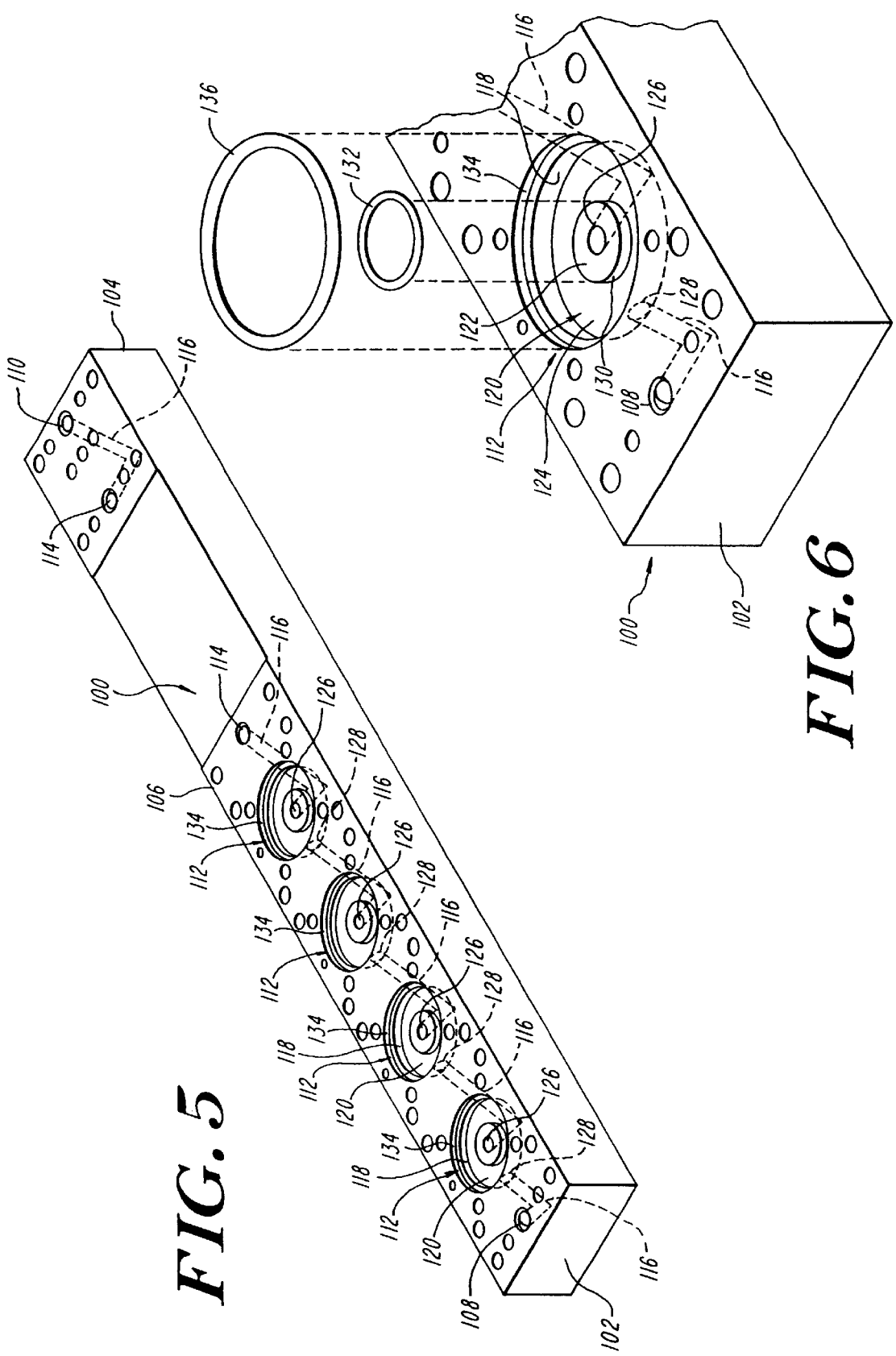
FIG. 5 is a top isometric view of one of the gas manifolds of the gas box system of FIG. 1.
FIG. 6 is an enlarged top isometric view of a portion of the gas manifold of FIG. 5 shown with o-rings.
Figure 7:
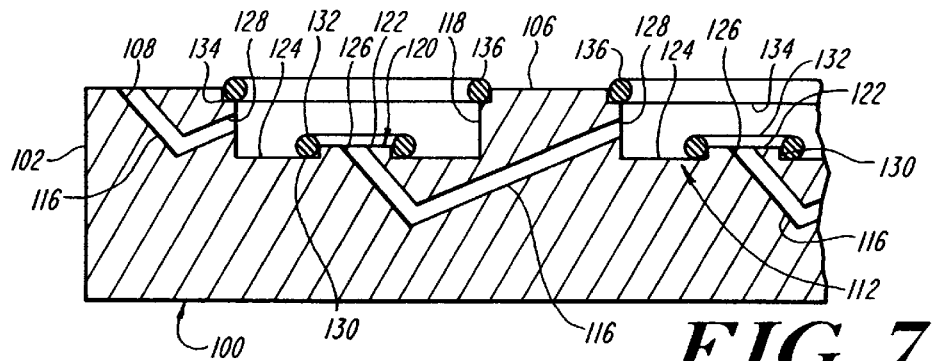
FIG. 7 is an enlarged sectional view of a portion of the gas manifold of FIG. 5 shown with gas seals.

In an effort to make components of the modular gas box system 10 of FIGS. 1 and 2 even more standardized and interchangeable, the present disclosure provides gas manifolds 100 having component stations 112 configured to receive standard annular o-rings and/or annular gaskets. Referring to FIGS. 5 through 7, a gas manifold 100 made in accordance with the present disclosure is shown.

The gas manifold 100 is for use as a central manifold in the process gas sticks 12 of the gas box system 10 of FIGS. 1 and 2. However, it should be understood that the other manifolds of the modular gas box system 10 of FIGS. 1 and 2 are preferably also provided with component stations similar to the component stations 112 of the gas manifold 100 of FIGS. 5 through 7.

As shown in FIG. 5, the manifold 100 is an elongated, rectangular, unitary and solid piece of suitable material, such as stainless steel. The manifold 100 includes first and second end surfaces 102, 104, and a top lateral surface 106 extending between the first and second end surfaces. The top lateral surface 106 defines an inlet port 108 near the first end surface 102, and an outlet port 110 near the second end surface 104. Extending successively from the inlet port 108 to the outlet port 110 on the top lateral surface 106 are four component stations 112, and mass flow controller ports 114. The successive ports 108, 110, 114 and stations 112 are connected by passageways 116 within the single-piece manifold 100. Each passageway 116 is preferably formed by two intersecting bores drilled from the top lateral surface 106 such that the passageways are generally V-shaped.

Each of the four component stations 112 includes an inwardly facing side wall 118 extending into the manifold 100 from the top surface 106 to a base 120 of the station. The base 120 is divided into a central portion 122 and an outer portion 124, with the central portion having a first station port 126, and one of the outer portion of the base and the side wall 118 having a second station port 128. As shown, the side wall 118 preferably has the second station port 128.

Preferably, the central portion 122 and the outer portion 124 of the base 120 of the component station 112 are coaxially arranged. In addition, the central portion 122 and the outer portion 124 are unequally spaced from the top surface 106 of the manifold 100 to provide a suitable seat for receiving an annular seal or o-ring 132 between the first station port 126 and the second station port 128.

In particular, the outer portion 124 of the base 120 of the component station 112 is spaced further from the top surface 106 of the manifold 100 than the central portion 122 of the base, and the base includes an outwardly facing side wall 130 extending between the outer and the central portions. As shown in FIGS. 6 and 7, an inner annular gasket or o-ring 132 is received around the outwardly facing side wall 130 of the base. Of course, the inner o-ring 132 extends from the outer portion 124 of the base to between the central portion 122 of the base and the top surface 106 of the manifold 100, such that a gas component received in the station 112 will compress the o-ring 132 to provide a seal around the first station port 126. It is intended that the central portion 122 of the base 120 of the component station 112, can also be used as a valve seat for valve components.

The top surface 106 of the manifold 100 includes continuous shoulders 134 around each of the component stations 112, and outer annular gaskets or o-rings 136 are received in the shoulders. The outer o-rings 136 extends above the top surface 106, such that gas components received in the stations 112 will compress the o-rings to provide a seal around the second station ports 128.

As shown, the passageways 116 extend in a longitudinal manner with respect to the manifold 100 between the inlet port 108, the component stations 112, the MFC station 100, and the outlet port 110. In addition, each station 112 is shown with only two station ports 126, 128. It should be understood, however, that a manifold constructed in accordance with the present disclosure can include component stations having more than two station ports and can include passageways that extend in a non-longitudinal manner with respect to the manifold.

Figure 8:
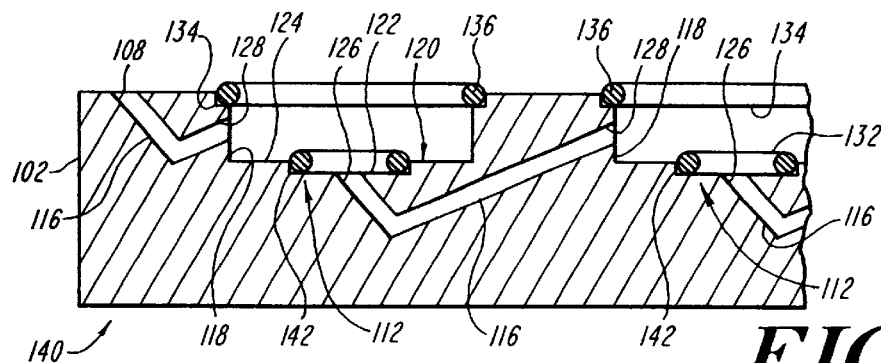
FIG. 8 is an enlarged sectional view of a portion of another gas manifold according to the present disclosure shown with o-rings.

Referring to FIG. 8, a portion of another gas manifold 140 according to the present disclosure is shown. The gas manifold 140 of FIG. 8 is similar to the gas manifold 100 of FIGS. 5 through 7, and elements that are the same have the same reference numerals.

The base 120 of the component station 112 of the gas manifold 140 of FIG. 8 has a central portion 122 spaced further from the top surface 106 of the manifold than the outer portion 124 of the base, and the base includes an inwardly facing side wall 142 extending between the central and the outer portions. As shown, the inner o-ring 132 is received within the inwardly facing side wall 142 of the base 120, around the first station port 126, and extends above the outer portion 124 of the base.

Figure 9:
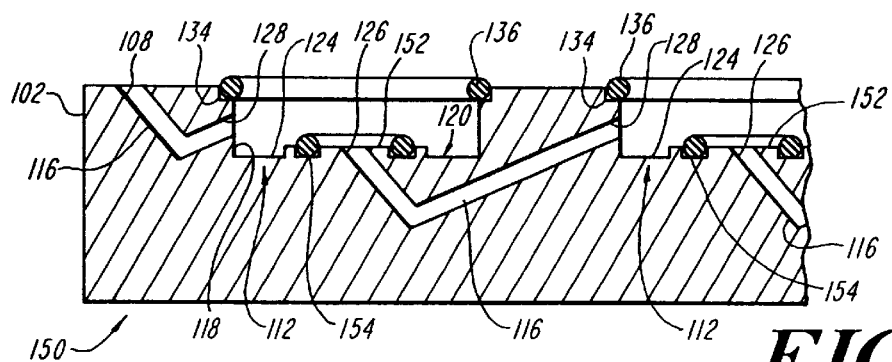
FIG. 9 is an enlarged sectional view of a portion of an additional gas manifold according to the present disclosure shown with o-rings.

Referring to FIG. 9, a portion of an additional gas manifold 150 according to the present disclosure is shown. The gas manifold 150 of FIG. 9 is similar to the gas manifold 100 of FIGS. 5 through 7, and elements that are the same have the same reference numerals. The component station 112 of the gas manifold 150 of FIG. 9 has a central portion 152 with a continuous groove 154 around the first station port 126, and the inner o-ring 132 is received in the groove 154. The inner o-ring 132 extends above the central portion 152 of the base, such that a gas component received in the station will compress the o-ring to provide a seal around the first station port 126.

Figure 10:
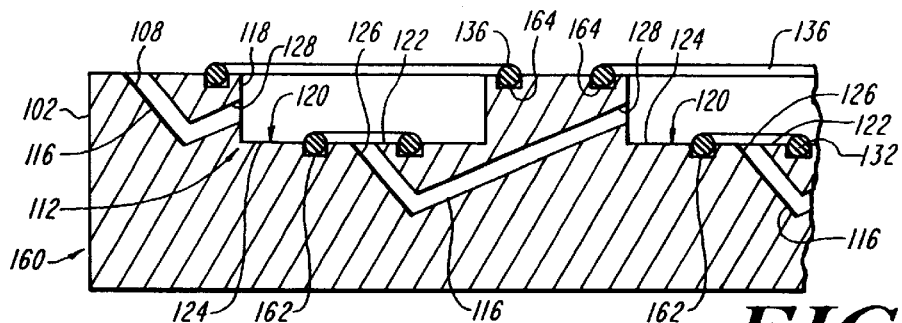
FIG. 10 is an enlarged sectional view of a portion of a further gas manifold according to the present disclosure shown with o-rings.

Referring to FIG. 10, a portion of a further gas manifold 160 according to the present disclosure is shown. The gas manifold 160 of FIG. 10 is similar to the gas manifold 100 of FIGS. 5 through 7, and elements that are the same have the same reference numerals. The outer portion 124 and the central portion 122 of the base 120 of the component station 112 of the gas manifold 160 of FIG. 10 are equally spaced from the top surface 106 of the manifold. The base 120 includes a continuous groove 162 separating the central portion 122 from the outer portion 124, and the inner o-ring 132 is received in the groove 162. The inner o-ring 132 extends above the base 120, such that a gas component received in the station 112 will compress the o-ring to provide a seal around the first station port 126. In addition, the top lateral surface 106 of the manifold 160 includes a continuous groove 164 around the component station 112, instead of a shoulder, and the outer o-ring 136 is received in the groove 164 and extends above the surface 106, such that a gas component received in the station 112 will compress the o-ring 136 to provide a seal around the second station port 128.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

What is claimed is:

1. A manifold for a gas box comprising:
   a surface;
   a manifold port in the surface;
   at least one station in the surface for receiving gas controlling and gas monitoring components, the station including an inwardly facing side wall extending into the manifold from the surface to a base of the station, the base divided into a central portion and an outer portion, the central portion including a first station port, and one of the outer portion of the base and the side wall including a second station port; and
   an internal gas passageway connecting the manifold port to one of the first and the second station ports.

2. A manifold according to claim 1, wherein the central portion and the outer portion of the base of the component station are coaxially arranged.

3. A manifold according to claim 2, wherein the central portion and the outer portion of the base of the component station are unequally spaced from the surface of the manifold.

4. A manifold according to claim 3, wherein the outer portion of the base of the component station is spaced further from the surface of the manifold than the central portion of the base, and the base includes an outwardly facing side wall extending between the outer and the central portions.

5. A manifold according to claim 4, further comprising a seal received around the outwardly facing side wall of the base of the component station, the seal extending from the outer portion of the base to between the central portion of the base and the surface of the manifold.

6. A manifold according to claim 4, wherein the central portion of the base of the component station includes a continuous groove around the first station port.

7. A manifold according to claim 6, further comprising a seal received in the groove of the central portion of the base of the component station.

8. A manifold according to claim 3, wherein the central portion of the base of the component station is spaced further from the surface of the manifold than the outer portion of the base, and the base includes an inwardly facing side wall extending between the central and the outer portions.

9. A manifold according to claim 8, further comprising a continuous seal received on the central portion of the base of the component station around the first station port, the seal extending from the central portion of the base to between the outer portion of the base and the surface of the manifold.

10. A manifold according to claim 2, wherein the central portion and the outer portion of the base of the component station are equally spaced from the surface of the manifold and the base includes a groove between the central and the outer portions.

11. A manifold according to claim 10, further comprising a seal received in the groove of the base of the component station.

12. A manifold according to claim 1, wherein the surface of the manifold includes a continuous shoulder around the component station.

13. A manifold according to claim 12, further comprising a seal received in the shoulder of the surface of the manifold.

14. A manifold according to claim 1, wherein the surface of the manifold includes a continuous groove around the component station.

15. A manifold according to claim 14, further comprising a seal received in the groove of the surface of the manifold.

16. A gas stick including a manifold according to claim 1, and further comprising a gas component received in the station of the manifold blocks, said gas components comprising at least one valve and at least one mass flow controller.

17. A gas stick according to claim 16, wherein the gas component comprises one of a purifier and a filter.

18. A gas stick according to claim 16, wherein the gas component comprises a pressure transducer.

19. A gas stick according to claim 16, wherein the gas component comprises a pressure regulator.

20. A gas stick according to claim 16, wherein the gas component comprises a valve.

* * * * *